United States Patent [19]

Harris

[11] Patent Number: 5,798,293
[45] Date of Patent: Aug. 25, 1998

[54] METHOD FOR PRODUCING A SEMICONDUCTOR LAYER OF SIC OF THE 3C-POLYTYPE AND A SEMICONDUCTOR DEVICE HAVING AN INSULATOR BETWEEN A CARRIER AND THE ACTIVE SEMICONDUCTOR LAYER

[75] Inventor: Christopher Harris, Sollentuna, Sweden

[73] Assignee: ABB Research Ltd., Zurich, Switzerland

[21] Appl. No.: 804,685

[22] Filed: Feb. 25, 1997

[51] Int. Cl.⁶ .............................. H01L 21/30; H01L 21/46
[52] U.S. Cl. ........................................ 438/459; 438/931
[58] Field of Search ............................ 438/455, 459, 438/931

[56] References Cited

U.S. PATENT DOCUMENTS

| | | |
|---|---|---|
| 4,983,538 | 1/1991 | Gotou . |
| 5,349,207 | 9/1994 | Malhi . |
| 5,455,202 | 10/1995 | Malloy et al. . |
| 5,466,631 | 11/1995 | Ichikawa et al. . |
| 5,654,208 | 8/1997 | Harris et al. ........................ 438/522 |
| 5,674,765 | 10/1997 | Rottner et al. . |

FOREIGN PATENT DOCUMENTS 4 234 508   4/1994   Germany .

OTHER PUBLICATIONS

Cioccio et al., Silicon carbide on insulator formation using the smart cut process, Electronics Letters, 1996, vol. 32, No. 12, pp. 1144–1145.

Tong et al., Silicon Carbide Wafer Bonding, J. Electrochem. Society, 1995, vol. 142, No. 1, pp. 232–236.

*Primary Examiner*—John Niebling
*Assistant Examiner*—Richard A. Booth
*Attorney, Agent, or Firm*—Pollock, Vande Sande & Priddy

[57] ABSTRACT

In a method for producing a semiconductor layer (8) of SiC of the 3C-polytype on top of a semiconductor substrate layer (6) the wafer-bonding technique is utilised. Two amorphous layers are placed face to face and bonded by heating them, and the piece so obtained is annealed at such a high temperature that the material of the amorphous layers is allowed to flow for relaxing a 3C-SiC-layer (4) on top thereof. A second layer (8) of 3C-SiC is after that epitaxially regrown on top of said relaxed 3C-SiC-layer.

10 Claims, 1 Drawing Sheet

METHOD FOR PRODUCING A SEMICONDUCTOR LAYER OF SIC OF THE 3C-POLYTYPE AND A SEMICONDUCTOR DEVICE HAVING AN INSULATOR BETWEEN A CARRIER AND THE ACTIVE SEMICONDUCTOR LAYER

TECHNICAL FIELD OF THE INVENTION AND PRIOR ART

The present invention relates to a method for producing a semiconductor layer of SiC of the 3C-polytype on top of a semiconductor substrate layer as well as a semiconductor device having an insulator between a carrier and the active semiconductor layer.

It is known that SiC is a semiconductor material that is very attractive for semiconductor devices, such as diodes, transistors and thyristors, for high power applications. A high breakdown voltage and a high thermal stability may be mentioned as some of the advantageous properties of SiC.

There are a number of different polytypes of single crystal SiC, among which the cubic form 3C has many favorable properties for high power devices including the highest electron mobility of all realised SiC polytypes. Despite these advantages it has not been widely viewed as a material for high performance devices. 3C can not be easily grown in bulkform, and the absence of bulk material has limited progress in device technology based on 3C. The sublimation technology used for growth of bulks of SiC requiring temperatures above 20000° C. has not been successfully used for growing the 3C-polytype.

It has been shown that is possible to grow an epilayer of 3C on a substrate of Si using a buffer layer technique, e.g. growing a carbonisation layer on top of Si and then SiC thereon. The buffer is required due to the fact that the Si lattice constant is much higher than the lattice constant for Si. The resulting 3C is highly strained and contains a high dislocation density. Devices produced in such material demonstrate for example high leakage and poor mobility particularly at higher temperatures.

SUMMARY OF THE INVENTION

The object of the present invention is to provide a method for producing a semiconductor layer of SiC of the 3C-polytype on top of a semiconductor substrate layer making it possible to obtain SiC of the 3C-polytype having a higher quality than achieved until now, so that the problems mentioned above may be overcome.

This object is according to the invention obtained by providing such a method comprising the following steps:

1) growing a buffer layer on a first substrate layer of a first material and a layer of 3C-SiC on top of the buffer layer,
2) forming a first amorphous layer on top of the layer of 3C-SiC,
3) forming a second amorphous layer of the same material as the first one on top of a second substrate layer of a second material,
4) placing the upper surfaces of said amorphous layers carried by said two substrate layers face to face and bonding thereof by heating them for forming a single piece,
5) removing said first substrate layer and the buffer layer from said piece by etching,
6) annealing said piece at such a high temperature that the material of the amorphous layers undergoes viscous flow for relaxing said 3C-SiC-layer for forming a surface layer of a substrate onto which 3C-SiC may be epitaxially grown,
7) epitaxially regrowing a second layer of 3C-SiC on top of said relaxed 3C-SiC-layer, said steps 1)–7) being carried out in the order mentioned except for the removal of the buffer layer, which may be carried out before step 6) or after step 6) but before step 7).

High quality 3C-SiC-layers may in this way be produced by using the wafer-bonding technique in a new way. By carrying out said annealing of the piece resulting from the wafer-bonding at such a high temperature that the material of the amorphous layers used to bond the two wafers to each other is allowed to flow, the 3C-SiC-layer produced in step 1) will relax enabling an epitaxial regrowing of 3C-SiC of an excellent quality on top thereof. It is in this way not only possible to produce layers of the 3C-polytype having many favorable properties for high power devices, but this may also be done in a much cheaper way than for other polytypes, for the production of which it is necessary to grow bulks owing to the higher temperatures needed. For the 3C-polytype there is no need of any bulk, but inexpensive large area substrates may be used for the growth, such as large diameters Si-substrates commercially available at low costs.

DE 4 234 508 illustrates how SiC may be grown by Chemical Vapour Deposition on top of Si by using a carbonisation layer as buffer layer. However, the quality of the SiC produced in this way may not be expected to be as high as desired.

U.S. Pat. No. 5 349 207 describes how a wafer of SiC is bonded to a wafer of Si by growing SiGe-layers on said two wafers and bonding the wafers by placing these SiGe-layers face to face. However, neither any annealing for relaxation of the SiC-layer nor any regrowth on top there of are carried out in this already known method.

Furthermore, silicon carbide wafer-bonding without any relaxation and any regrowth of SiC is already known through the article "Silicon carbide wafer-bonding" in J. Electrochem. Soc., Vol. 142, No. 1, January 1995 (concerning 3C) and the article "Silicon carbide on insulator formation using the smart cut process" in Electronics Letters, 6th Jun., 1996, Vol. 32, No. 12 (concerning 6H).

According to a preferred embodiment of the invention said first material forming said first substrate layer is Si. Si-wafers are available at large diameters and low costs making it possible to grow large area epi-layers of 3C-SiC by using Si as substrate layer.

According to another preferred embodiment of the invention said second material forming the second substrate layer is Si. This characteristic of the invention has the same advantage as in the first embodiment mentioned with respect to the availability as large area substrate at low costs, and it has also the advantage that said second amorphous layer may be easily formed thereon by producing $SiO_2$ through thermal oxidation.

According to another preferred embodiment of the invention said amorphous layers are formed by $SiO_2$. The $SiO_2$-layers may be formed by thermal oxidation, but they may also be formed by deposition on the 3C-SiC-layer and on said second substrate layer, which not at all has to be of Si enabling the formation of $SiO_2$ by thermal oxidation. $SiO_2$ may be easily bonded to each other without any requirement of extremely high temperatures.

According to another preferred embodiment of the invention said amorphous layers are formed by deposition of AlN on top of the layer of 3C-SiC in step 2) and on top of the second substrate layer in step 3). An advantage of using AlN for the bonding is that AlN will be an insulator between the substrate and the 3C-SiC-layer in a possible semiconductor device and AlN can take the same high temperatures as SiC.

According to another preferred embodiment of the invention said layers of 3C-SiC is in steps 1) and 7) grown by Chemical Vapour Deposition at a temperature below 1500° C.

According to another, very preferred embodiment of the invention the surface of said 3C-SiC-layer is after step 1) and before 2) cleaned for making it substantially particle-free. This is very important for obtaining the highest possible quality of the 3C-SiC-layer regrown, since possible dust particles on the layer of 3C-SiC grown in step 1) will otherwise result in a transfer of a degraded surface quality of the 3C-layer to said first amorphous layer. This means that the two amorphous layers placed face to face in step 4, will not touch at all places, so that pockets may be formed therebetween and the result of the bonding will be deteriorated. Thus, this cleaning is the key to a high quality of the bonding and of the 3C-SiC-layer regrown.

It is also an object of the present invention to provide a semiconductor device having an insulator between a carrier and the active semiconductor layer having excellent properties making it in particular well suited for the use in high frequency applications. This object is obtained by providing such a device that comprises the product obtained by carrying out the method of any of claims 1–10, and in which said second substrate layer forms a carrier, said amorphous layers an insulating layer and the second layer of the 3C-SiC forms said active semiconductor layer. In this way a lateral device well suited for high frequencies may be formed. The insulating layer will cut off current paths through the substrate and leakage will be prevented, so that the big problem of power loss through the substrate due to leakage current therethrough in high frequency or thin devices may be solved.

According to a preferred embodiment of the invention said semiconductor device is a field effect transistor. The high quality semiconductor layer produced according to the invention is particularly well suited to the manufacture of a lateral field effector transistor, such as a JFET, a MOSFET, a MISFET and a MESFET.

According to another preferred embodiment of the invention said semiconductor device is a MISFET with the base layer being a part of said active layer, said base layer is doped according to a first doping type being n or p, a source region layer of a second doping type being opposite to said first doping type and a drain region layer of said second doping type are formed in the SiC layer at the surface thereof at a lateral distance from each other and laterally separated by said base layer, an insulating layer and a gate on top thereof are applied on the SiC-layer and covering at least the lateral distance between the source region layer and the drain region layer, and a source contact is provided on the source region layer and a drain contact on the drain region layer. The gate is connectable to a voltage for creating a conducting inversion channel between the source and drain region at the interface between the SiC-layer and said insulating layer. This is a preferred device producable through the method according to the present invention.

Further preferred characteristics and advantages of the invention appear from the following description and the other dependent claims.

BRIEF DESCRIPTION OF THE DRAWING

With reference to the appended drawing, below follows a specific description of preferred embodiments of the invention cited as examples.

In the drawing.

DETAILED DESCRIPTION OF PREFERRED EMBODIMENTS OF THE INVENTION

It is schematically illustrated in FIG. 1–6 how a method for producing a semiconductor layer of SiC of the 3C-polytype on top of a semiconductor substrate layer according to a preferred embodiment of the invention may be carried out, but it is emphasised that the description of this embodiment is only made for explaining the idea of the invention and is not to be interpreted as limiting the scope of the invention. The first step of the method according to this particular embodiment is to grow a thin buffer layer 1, which is here only indicated by a line, on a first substrate layer 2 of Si. The buffer layer may be a so called carbonisation layer grown on top of the Si-layer 2 owing to the fact that the lattice factor of Si is much higher than the lattice factor for SiC and it would not be possible to grow a layer of SiC directly on top of the Si-layer 2. After that, a layer 3 of SiC of the 3C-polytype is grown on top of the buffer layer 1 by Chemical Vapour Deposition (CVD) at a temperature below 1450° C., preferably between 1250° and 1400° C. 3C is the only SiC-polytype that is stable at such low temperatures, so that the layer 3 will get a lattice according to this polytype. The surface of said 3C-SiC-layer 3 is then cleaned for making it substantially particle-free, which is of importance for the surface quality of a first amorphous layer described in the next paragraph.

Figure 1:
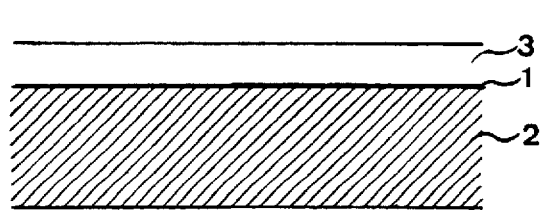
FIG. 1–4 are very schematical section views illustrating different steps of a method for producing a semiconductor layer of SiC of the 3C-polytype according to a preferred embodiment of the invention.
Figure 2:
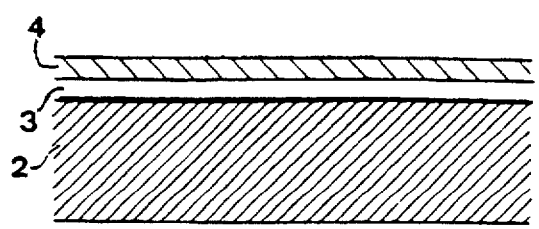
Figure 3:
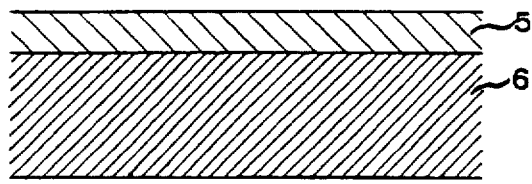

It is illustrated in FIG. 2 how a first amorphous layer 4 is formed on top of the layer 3 of 3C-SiC, in this case this is accomplished by carrying out a thermal oxidation of a surface layer of the layer 3 for forming said layer 4 of SiO$_2$.

After that a second amorphous layer 5 of the same material as the first one, i.e. SiO$_2$, is formed on top of a second substrate layer 6 of a second semiconductor material, which here is also Si, and the layer 5 is formed by thermal oxidation of a surface layer of the Si-layer 6. It is evident and within the scope of the present invention that it may as well be started by producing the piece shown in FIG. 3 and after that carry out the steps illustrated in FIG. 1 and 2.

Figure 4:
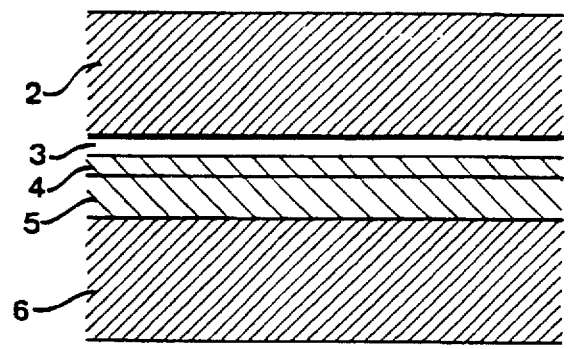

It is illustrated in FIG. 4 how after that the upper surfaces of said two amorphous layers 4 and 5 are placed face to face, they are bonded to each other by heating them for forming a single piece. The particle-free cleaning mentioned further above is of importance for obtaining a high quality of the surface of the SiO$_2$-layer, so that the surfaces will touch at substantially all places when the bonding is carried out and by that the formation of pockets between the layers 4 and 5 will be avoided.

Figure 5:
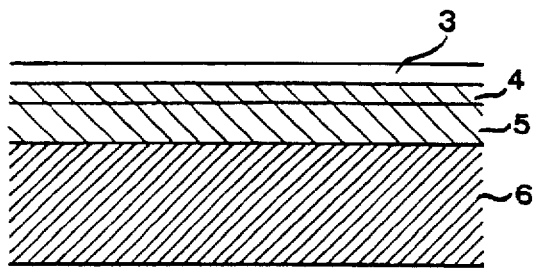
Figure 6:
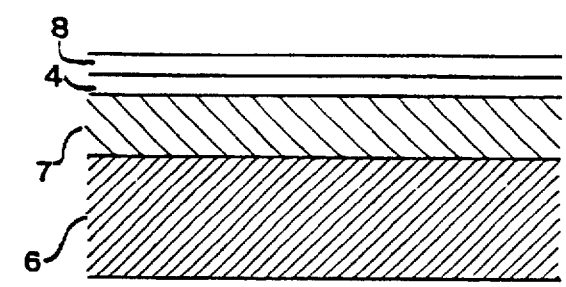

It is shown in FIG. 5 how the first substrate layer 2 and the buffer layer 1 and also the poorest quality interface between the original buffer layer and the 3C-SiC-layer 3 are removed by polishing and etching. After that the said piece is annealed at such a high temperature, that the material of the amorphous layers is allowed to flow so as to relax said 3C-SiC-layer 4. The amorphous layers form by this a substantially continuous layer 7. Finally, a second layer 8 of 3C-SiC is epitaxially regrown by Chemical Vapour Deposition at a temperature below 1450° C. (in the case of SiO$_2$), preferably between 1250° and 1400° C., on top of said relaxed 3C-SiC-layer 4, which allows a substantially better quality 3C to be obtained thanks to said relaxation. As an alternative, the buffer layer and said poorest quality interface may be removed after said annealing.

Figure 7:
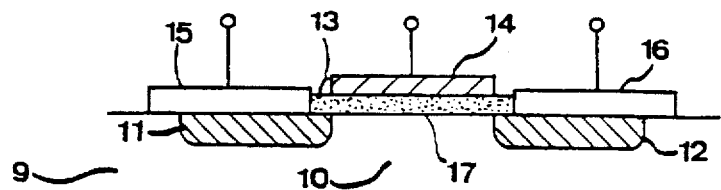
FIG. 7 is a simplified section view of a semiconductor device according to a preferred embodiment of the invention.
Figure 7:
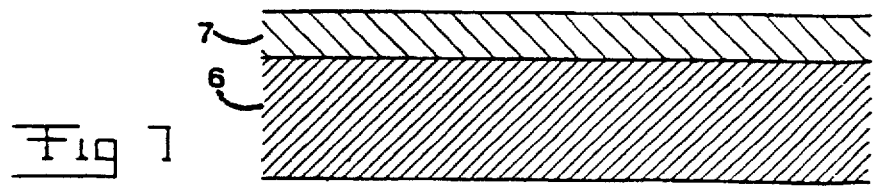

A semiconductor piece produced in this way will find a preferred use in primarily high frequency and high temperature lateral devices, such as JFET's, MOSFET's, MISFET's and MESFET's. In such devices the piece produced according to the method of the invention will have said amorphous layers of an insulating material, just as shown above, so that these devices will have their active layer insulated from the substrate, and by that use the so called SOI-technology (Semiconductor On Insulator). A MISFET according to the invention so obtained is schematically illustrated in FIG. 7. Accordingly, this semiconductor device has a substrate layer 6 of Si, an insulating layer 7 of $SiO_2$ placed on top thereof and on top of this an active layer 9 of SiC of the 3C-polytype. A part of the active layer 9 forms a base layer 10, which is doped according to a first doping type being n or p. A source region layer 11 of a second doping type being opposite to said first doping type and a drain region layer 12 of said second doping type are formed in the SiC-layer 9 at the surface thereof at a lateral distance from each other and laterally separated by said base layer 10. The doping of the base layer has preferably been obtained by introducing dopants when epitaxially growing at least said sub-layer 8 of the layer 9. The doping of the source region layer 11 and the drain region layer 12 has preferably been obtained by ion implantation.

The device has also an insulating layer 13, for instance of $SiO_2$ or AlN, and a gate 14 on top thereof on the SiC-layer and covering at least the lateral distance between the source region layer and the drain region layer. A source contact 15 is provided on the source region layer and a drain contact 16 on the drain region layer. The gate 14 is connectable to a voltage for creating a conducting inversion channel between a source region layer 11 and the drain region layer 12 at the interface 17 between the SiC-layer 9 and the insulating layer 13. Thanks to the existence of the other insulating layer 7 between the substrate 6 and the active layer 9 it will be avoided that current paths between the source region layer 11 and the drain region layer 12 will go through the substrate 6. Accordingly, there will be no problem caused by any leakage current and resulting in the creation of excessive heat in the substrate 6. Thus, such a device may be used for high switching frequencies and it may also be made comparatively thin.

The invention is of course not in any way restricted to the embodiments described above, but many possibilities to modifications thereof would be apparent to a man with ordinary skill in the art without departing from the basic idea of the invention as defined in the appended claims.

It is emphasised that the relation of the layer thicknesses illustrated in the figure is only chosen for the sake of illustrating the invention and the real relations may be totally different.

The different substrate layers may be of other materials than Si, and the two substrate layers may be of different materials.

It is also possible to form the $SiO_2$-layers by deposition instead of by thermal oxidation.

The amorphous layers may be of another material than $SiO_2$, for instance of AlN, which can take higher temperatures than $SiO_2$.

All definitions concerning the materials of the different layers do of course include inevitable impurities as well as intentional doping of the layers in question.

The definition layer is to be interpreted broadly and comprises all types of volume extensions and shapes.

I claim:

1. A method for producing a semiconductor layer of SiC of the 3C-polytype on top of a semiconductor substrate layer, comprising the steps of:

1) growing a buffer layer (1) on a first substrate layer (2) of a first material and a layer (3) of 3C-SiC on top of the buffer layer, 2) forming a first amorphous layer (4) on top of the layer of 3C-SiC, 3) forming a second amorphous layer (5) of the same material as the first amorphous layer on top of a second substrate layer (6) of a second material, 4) placing the upper surfaces of said amorphous layers (4, 5) carried by said two substrate layers (2, 6) face to face and bonding thereof by heating them for forming a single piece, 5) removing said first substrate layer (2) and the buffer layer (1) from said piece by etching, 6) annealing said piece at such a high temperature that the material of the amorphous layers (4, 5) undergoes viscous flow for relaxing said 3C-SiC-layer (3) for forming a surface layer of a substrate onto which 3C-SiC may be epitaxially grown, 7) epitaxially regrowing a second layer (8) of 3C-SiC on top of said relaxed 3C-SiC-layer (3), said steps 1)–7) being carried out in the order mentioned except for the removal of the buffer layer, which may be carried out before step 6) or after step 6) but before step 7).

2. A method according to claim 1, characterized in that said first material forming said first substrate layer (2) is Si.

3. A method according to claim 1, characterized in that the second material forming the second substrate layer (6) is Si.

4. A method according to claim 1, characterized in that said amorphous layers (4, 5) are formed of $SiO_2$.

5. A method according to claim 4, characterized in that the $SiO_2$-layer (4) is in step 2) formed by oxidising a surface layer of the layer (3) of 3CSiC.

6. A method according to claim 4, characterized in that said $SiO_2$-layer (5) is in step 3) formed by oxidising a surface layer of said second substrate layer (6).

7. A method according to any of claim 1, characterized in that said amorphous layers (4, 5) are formed by deposition of AlN on top of the layer (3) of 3C-SiC in step 2) and on top of the second substrate layer (6) in step 3).

8. A method according to any of claim 1, characterized in that said layers (3, 8) of 3C-SiC are in steps 1) and 7) grown by Chemical Vapour Deposition at a temperature below 1500° C.

9. A method according to any of claim 1, characterized in that after step 1) and before step 2) the surface of said 3C-SiC-layer (3) is cleaned for making it substantially particle-free.

10. A method according to claim 1, characterized in that the annealing to relax the original 3C layer takes place at a temperature below 1450° C.

* * * * *

UNITED STATES PATENT AND TRADEMARK OFFICE
CERTIFICATE OF CORRECTION

PATENT NO.      : 5,798,293
DATED           : August 25, 1998
INVENTOR(S)     : Harris It is certified that error appears in the above-identified patent and that said Letters Patent is hereby corrected as shown below:

Title page,
The title page should be deleted to appear as per attached title page.

Columns 1-6,
Please delete columns 1-6 and substitute columns 1-6 as per attached.

Signed and Sealed this

Third Day of December, 2002

JAMES E. ROGAN
*Director of the United States Patent and Trademark Office*

United States Patent [19]

Harris

[11] Patent Number: 5,798,293
[45] Date of Patent: Aug. 25, 1998

[54] METHOD FOR PRODUCING A SEMICONDUCTOR LAYER OF SIC OF THE 3C-POLYTYPE AND A SEMICONDUCTOR DEVICE HAVING AN INSULATOR BETWEEN A CARRIER AND THE ACTIVE SEMICONDUCTOR LAYER

[75] Inventor: Christopher Harris, Sollentuna, Sweden

[73] Assignee: ABB Research Ltd., Zurich, Switzerland

[21] Appl. No.: 804,685

[22] Filed: Feb. 25, 1997

[51] Int. Cl.⁶ .............................. H01L 21/30; H01L 21/46
[52] U.S. Cl. ............................................. 438/459; 438/931
[58] Field of Search ............................... 438/455, 459, 438/931

[56] References Cited

U.S. PATENT DOCUMENTS

| | | |
|---|---|---|
| 4,983,538 | 1/1991 | Gotou . |
| 5,349,207 | 9/1994 | Malhi . |
| 5,455,202 | 10/1995 | Malloy et al. . |
| 5,466,631 | 11/1995 | Ichikawa et al. . |
| 5,654,208 | 8/1997 | Harris et al. ........................ 438/522 |
| 5,674,765 | 10/1997 | Rottner et al. . |

FOREIGN PATENT DOCUMENTS 4 234 508  4/1994  Germany .

OTHER PUBLICATIONS

Cioccio et al., Silicon carbide on insulator formation using the smart cut process, Electronics Letters, 1996, vol. 32, No. 12, pp. 1144–1145.

Tong et al., Silicon Carbide Wafer Bonding, J. Electrochem. Society, 1995, vol. 142, No. 1, pp. 232–236.

*Primary Examiner*—John Niebling
*Assistant Examiner*—Richard A. Booth
*Attorney, Agent, or Firm*—Pollock, Vande Sande & Priddy

[57] ABSTRACT

In a method for producing a semiconductor layer of SiC of the 3C-polytype on top of a semiconductor substrate layer the wafer-bonding technique is utilized. Two amorphous layers are placed face to face and bonded by heating them, and the piece so obtained is annealed at such a high temperature that the material of the amorphous layers is allowed to flow for relaxing a 3C-SiC-layer on top thereof. A second layer of 3C-SiC is then epitaxially regrown on top of the relaxed 3C-SiC-layer.

10 Claims, 1 Drawing Sheet

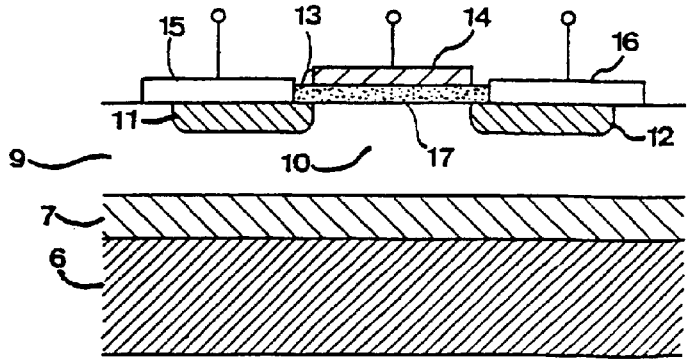

METHOD FOR PRODUCING A SEMICONDUCTOR LAYER OF SIC OF THE 3C-POLYTYPE AND A SEMICONDUCTOR DEVICE HAVING AN INSULATOR BETWEEN A CARRIER AND THE ACTIVE SEMICONDUCTOR LAYER

TECHNICAL FIELD

The present invention relates to a method for producing a semiconductor layer of SiC of the 3C-polytype on top of a semiconductor substrate layer and to a semiconductor device having an insulator between a carrier and the active semiconductor layer.

BACKGROUND OF THE INVENTION

It is known that SiC is a semiconductor material that is very attractive for semiconductor devices, such as diodes, transistors and thyristors, specially in high power applications. A high breakdown voltage and a high thermal stability may be mentioned as some of the advantageous properties of SiC.

There are a number of different polytypes of single crystal SiC, among which the cubic form 3C has many favorable properties for high powder devices including the highest electron mobility of all realized SiC polytypes. Despite these advantages it has not been widely viewed as a material for high performance devices since 3C can not be easily grown in bulk-form, and the absence of bulk material has limited progress in device technology based on 3C. The sublimation technology used for growth of bulks of SiC requiring temperatures above 2000° C. has not been successfully used for growing the 3C-polytype.

It has been possible to grow an epilayer of 3C on a substrate of, Si using a buffer layer technique, e.g. growing a carbonization layer on top of Si and then SiC thereon. The buffer is required due to the fact that the Si lattice constant is much higher than the lattice constant for Si. The resulting 3C is highly strained and contains a high dislocation density. Devices produced of such material demonstrate for example high leakage and poor mobility particularly at higher temperatures.

SUMMARY OF THE INVENTION

The object of the present invention is to provide a method for producing a semiconductor layer of SiC of the 3C-polytype on top of a semiconductor substrate layer making it possible to obtain SiC of the 3C-polytype having a higher quality than achieved until now, so that the problems mentioned above may be overcome.

This object is according to the invention obtained by providing a method comprising the following steps:

1) growing a buffer layer on a first substrate layer of a first material and a layer of 3C-SiC on top of the buffer layer,
2) forming a first amorphous layer on top of the layer of 3C-SiC,
3) forming a second amorphous layer of the same material as the first material on top of a second substrate layer of a second material,
4) placing the upper surfaces of the amorphous layers carried by the two substrate layers face to face and bonding thereof by heating them for forming a single piece,
5) removing the first substrate layer and the buffer layer from the piece by etching,
6) annealing the piece at such a high temperature that the material of the amorphous layers undergoes viscous flow for relaxing the 3C-SiC-layer for forming a surface layer of a substrate onto which 3C-SiC may be epitaxially grown,
7) epitaxially regrowing a second layer of 3C-SiC on top of relaxed 3C-SiC-layer, wherein steps 1)–7 are carried out in the order mentioned except for the removal of the buffer layer, which may be carried out before or after step 6) but before step 7).

High quality 3C-SiC-layers may, in this way, be produced by using the wafer-bonding technique in a new way. By carrying out annealing of the piece resulting from the wafer-bonding at such a high temperature that the material of the amorphous layers used to bond the two wafers to each other is allowed to flow, the 3C-SiC-layer produced in step 1) will relax enabling an epitaxial regrowing of 3C-SiC of an excellent quality on top thereof. It is in this way not only possible to produce layers of the 3C-polytype having many favorable properties for high power devices, but this may also be done in a much less expansive way than for other polytypes, for the production of which it is necessary to grow bulks due to the higher temperatures needed. For the 3C-polytype there is no need of any bulk, but inexpensive large area substrates may be used for the growth, such as large diameters Si-substrates commercially available at low cost.

DE 4 234 508 illustrates how SiC may be grown by Chemical Vapor Deposition on top of Si by using a carbonization layer as buffer layer. However, the quality of the SiC produced in this way may not be expected to be as high as desired. U.S. Pat. No. 5,349,207 describes how a wafer of SiC is bonded to a wafer of Si by growing SiGe-layers on the two wafers and bonding the wafers by placing these SiGe-layers face to face. However, neither any annealing for relaxation of the SiC-layer nor any regrowth on top thereof are carried out in this known method.

Furthermore, silicon carbide wafer-bonding without any relaxation and any regrowth of SiC is already known through the article "Silicon carbide wafer-bonding" in J. Electrochem. Soc., Vol. 142, No. 1, January 1995 (concerning 3C) and the article "Silicon carbide on insulator formation using the smart cut process" in Electronics Letters, 6th Jun., 1996, Vol. 32, No. 12 (concerning 6H).

According to a preferred embodiment of the invention the first material forming the first substrate layer is Si. Si-wafers are available at large diameters and low cost making it possible to grow large area epilayers of 3C-SiC by using Si as substrate layer.

According to another preferred embodiment of the invention the second material forming the second substrate layer is Si. This characteristic of the invention has the same advantage as in the first embodiment mentioned with respect to the availability of large area substrate at low cost, and it has also the advantage that the second amorphous layer may be easily formed thereon by producing $SiO_2$ through thermal oxidation.

According to another preferred embodiment of the invention the amorphous layers are formed by $SiO_2$. The $SiO_2$-layers may be formed by thermal oxidation, but they may also be formed by deposition on the 3C-SiC-layer and on the second substrate layer, which not at all has to be of Si enabling the formation of $SiO_2$ by thermal oxidation. $SiO_2$ may be easily bonded to each other without any requirement for extremely high temperatures.

According to another preferred embodiment of the invention the amorphous layers are formed by deposition of AlN on top of the layer of 3C-SiC in step 2) and on top of the second substrate layer in step 3). An advantage of using AlN for the bonding is that AlN will be an insulator between the substrate and the 3C-SiC-layer in a possible semiconductor device and AlN can withstand the same high temperatures as SiC.

According to another preferred embodiment of the invention the layers of 3C-SiC are in steps 1) and 7) grown by Chemical Vapor Deposition at a temperature below 1500° C.

According to another, preferred embodiment of the invention the surface of the 3C-SiC-layer is after step 1) and before 2) cleaned to make it substantially particle-free. This is very important for obtaining the highest possible quality of the 3C-SiC-layer regrown, since possible dust particles on the layer of 3C-SiC grown in step 1) will otherwise result in a transfer of a degraded surface quality of the 3C-layer to the first amorphous layer. This means that the two amorphous layers placed face to face in step 4, will not touch at all places, so that pockets may be formed therebetween and the result of the bonding will be deteriorated. Thus, this cleaning is the key to a high quality of the bonding and of the 3C-SiC-layer regrown.

It is also an object of the present invention to provide a semiconductor device having an insulator between a carrier and the active semiconductor layer having excellent properties making it particularly well suited for use in high frequency applications. This object is obtained by providing a device that comprises the product obtained by carrying out the method of the present invention and in which the second substrate layer forms a carrier, the amorphous layers an insulating layer and the second layer of the 3C-SiC forms the active semiconductor layer. In this way a lateral device well suited for high frequencies may be formed. The insulating layer will cut off current paths through the substrate and leakage will be prevented, so that the significant problem of power loss through the substrate due to leakage current therethrough in high frequency or thin devices may be solved.

According to a preferred embodiment of the invention the semiconductor device is a field effect transistor. The high quality semiconductor layer produced according to the invention is particularly well suited for the manufacture of a lateral field effector transistor, such as a JFET, a MOSFET, a MISFET and a MESFET.

According to another preferred embodiment of the invention the semiconductor device is a MISFET with the base layer being a part of the active layer, the base layer is doped according to a first doping type being n or p, a source region layer of a second doping type being opposite to the first doping type and a drain region layer of the second doping type are formed in the SiC layer at the surface thereof at a lateral distance from each other and laterally separated by the base layer, an insulating layer and a gate on top thereof are applied on the SiC-layer and covering at least the lateral distance between the source region layer and the drain region layer, and a source contact is provided on the source region layer and a drain contact on the drain region layer. The gate is connectable to a voltage for creating a conducting inversion channel between the source and drain region at the interface between the SiC-layer and the insulating layer. This is a preferred device producable through the method according to the present invention.

BRIEF DESCRIPTION OF THE DRAWING

With reference to the appended drawing, below follows a specific description of preferred embodiments of the invention cited as examples.

In the drawing:

FIG. 1–6 are schematical section views illustrating different steps of a method for producing a semiconductor layer of SiC of the 3C-polytype according to a preferred embodiment of the invention, and FIG. 7 is a simplified section view of a semiconductor device according to a preferred embodiment of the invention.

DETAILED DESCRIPTION OF PREFERRED EMBODIMENTS

FIGS. 1–6 schematically illustrate how a method for producing a semiconductor layer of SiC of the 3C-polytype on top of a semiconductor substrate layer according to a preferred embodiment of the invention may be carried out. However it is emphasized that the description of this embodiment is only made for explaining the idea of the invention and is not to be interpreted as limiting the scope of the invention. The first step of the method according to this particular embodiment is to grow a thin buffer layer 1, here only indicated by a line, on a first substrate layer 2 of Si. The buffer layer may be a so called carbonization layer grown on top of the Si-layer 2 due to the fact that the lattice factor of Si is much higher than the lattice factor for SiC and it would not be possible to grow a layer of SiC directly on top of the Si-layer 2. After that, a layer 3 of SiC of the 3C-polytype is grown on top of the buffer layer 1 by Chemical Vapor Deposition (CVD) at a temperature below 1450° C., preferably between 1250 and 1400° C. 3C is the only SiC-polytype that is stable at such low temperatures, so the layer 3 gets a lattice according to this polytype. The surface of 3C-SiC-layer 3 is then cleaned to make it substantially particle-free, which is of importance for the surface quality of a first amorphous layer described in the next paragraph.

It is illustrated in FIG. 2 how a first amorphous layer 4 is formed on top of the layer 3 of 3C-SiC; in this case this is accomplished by carrying out a thermal oxidation of a surface layer of the layer 3 to form the layer 4 of $SiO_2$.

After that a second amorphous layer 5 of the same material as the first material, i.e. $SiO_2$, is formed on top of a second substrate layer 6 of a second semiconductor material, which here is also Si, and the layer 5 is formed by thermal oxidation of a surface layer of the Si-layer 6. It is evident and within the scope of the present invention that it may as well be started by producing the piece shown in FIGS. 3 and after that carrying out the steps illustrated in FIG. 1 and 2.

FIG. 4 illustrates how after the upper surfaces of two amorphous layers 4 and 5 are placed face to face, they are bonded to each other by heating them to form a single piece. The particle-free cleaning mentioned above is of importance for obtaining a high quality of the surface of the $SiO_2$-layer, so that the surfaces will touch at substantially all places when the bonding is carried out and the formation of pockets between the layers 4 and 5 will be avoided.

It is shown in FIG. 5 how the first substrate layer 2 and the buffer layer 1 and also the poorest quality interface between the original buffer layer and the 3C-SiC-layer 3 are removed by polishing and etching. Then, the piece is annealed at such a high temperature, that the material of the amorphous layers is allowed to flow to relax the 3C-SiC-layer 4. The amorphous layers form by this a substantially continuous layer 7. Finally, a second layer 8 of 3C-SiC is epitaxially regrown by Chemical Vapor Deposition at a temperature below 1450° C. (in the case of $SiO_2$), preferably between 1250 and 1400° C., on top of the relaxed 3C-SiC-layer 4, which allows a substantially better quality 3C to be obtained as a result of the relaxation. As an alternative, the buffer layer and the poorest quality interface may be removed after annealing.

A semiconductor piece produced in this way will find a preferred use in high frequency and high temperature lateral devices, such as JFET's, MOSFET's, MISFET's and MESFET's. In such devices the piece produced according to the method of the invention will have amorphous layers of an insulating material, just as shown above, so that these devices will have their active layer insulated from the substrate, and by that use the so called SOI-technology (Semiconductor On Insulator). A MISFET obtained according the invention is schematically illustrated in FIG. 7. Accordingly, this semiconductor device has a substrate layer 6 of Si, an insulating layer 7 of $SiO_2$ placed on top thereof and on top of this an active layer 9 of SiC of the 3C-polytype. A part of the active layer 9 forms a base layer 10, which is doped according to a first doping type being n or p. A source region layer 11 of a second doping type being opposite to the first doping type and a drain region layer 12 of second doping type are formed in the SiC-layer 9 at the surface thereof at a lateral distance from each other and laterally separated by the base layer 10. The doping of the base layer has preferably been obtained by introducing dopants when epitaxially growing at least the sub-layer 8 of the layer 9. The doping of the source region layer 11 and the drain region layer 12 has preferably been obtained by ion implantation.

The device has also an insulating layer 13, for instance of $SiO_2$ or AlN, and a gate 14 on top thereof on the SiC-layer and covering at least the lateral distance between the source region layer and the drain region layer. A source contact 15 is provided on the source region layer and a drain contact 16 on the drain region layer. The gate 14 is connectable to a voltage create a conducting inversion channel between a source region layer 11 and the drain region layer 12 at the interface 17 between the SiC-layer 9 and the insulating layer 13. Thanks to the existence of the other insulating layer 7 between the substrate 6 and the active layer 9 it is avoided that current paths between the source region layer 11 and the drain region layer 12 would go through the substrate 6. Accordingly, there will be no problem caused by any leakage current resulting in the creation of excessive heat in the substrate 6. Thus, such a device may be used for high switching frequencies and it may also be made comparatively thin.

The invention is of course not in any way restricted to the embodiments described above, but many possibilities of modifications thereof would be apparent to a man with ordinary skill in the art without departing from the basic idea of the invention as defined in the appended claims.

It is emphasized that the relation of the layer thicknesses illustrated in the figure is only chosen for the sake of illustrating the invention and the real relations may be totally different.

The different substrate layers may be made of materials other than Si, and the two substrate layers may be of different materials.

It is also possible to form the $SiO_2$-layers by deposition instead of thermal oxidation.

The amorphous layers may be of other material than $SiO_2$, for instance of AlN, which can take higher temperatures than $SiO_2$.

All definitions concerning the materials of the different layers do of course include inevitable impurities as well as intentional doping of the layers in question.

The definition "layer" is to be interpreted broadly and comprises all types of volume extensions and shapes.

I claim:

1. A method for producing a semiconductor layer of SiC of the 3C-polytype on top of a semiconductor substrate layer, comprising the steps of:
   1) growing a buffer layer on a first substrate layer of a first material and a layer of 3C-SiC on top of the buffer layer,
   2) forming a first amorphous layer on top of the layer of 3C-SiC,
   3) forming a second amorphous layer of the same material as the first amorphous layer on top of a second substrate layer of a second material,
   4) placing the upper surfaces of said amorphous layers carried by said two substrate layers face to face and bonding by heating them to form a single piece,
   5) removing said first substrate layer and the buffer layer from said piece by etching,
   6) annealing said piece at such a high temperature that the material of the amorphous layers undergoes viscous flow for relaxing said 3C-SiC-layer to form a surface layer of a substrate onto which 3C-SiC may be epitaxially grown,
   7) epitaxially regrowing a second layer of 3C-SiC on top of said relaxed 3C-SiC-layer,
      wherein said steps 1)–7) are carried out in the order mentioned except for the removal of the buffer layer, which may be carried out before step 6) or after step 6) but before step 7).

2. A method according to claim 1, wherein said first material forming said first substrate layer is Si.

3. A method according to claim 1, wherein the second material forming the second substrate layer is SI.

4. A method according to claim 1, wherein said amorphous layers are formed of $SiO_2$.

5. A method according to claim 4, wherein the $SiO_2$-layer is in step 2) formed by oxidizing a surface layer of the layer of 3C-SiC.

6. A method according to claim 4, wherein said $SiO_2$-layer is in step 3) formed by oxidizing a surface layer of said second substrate layer.

7. A method according to claim 1, wherein said amorphous layers are formed by deposition of AlN on top of the layer of 3C-SiC in step 2) and on top of the second substrate layer in step 3).

8. A method according to claim 1, wherein said layers of 3C-SiC are in steps 1) and 7) grown by Chemical Vapor Deposition at a temperature below 1500° C.

9. A method according to claim 1, wherein after step 1) and before step 2) the surface of said 3C-SiC layer is cleaned to make it substantially particle-free.

10. A method according to claim 1, wherein the annealing to relax the original 3C layer takes place at a temperature below 1450° C.

* * * * *